United States Patent
Yan et al.

(10) Patent No.: US 7,990,230 B2
(45) Date of Patent: *Aug. 2, 2011

(54) TEMPERATURE COMPENSATION ATTENUATOR

(75) Inventors: Yuejun Yan, Shenzhen (CN); Yuepeng Yan, Shenzhen (CN)

(73) Assignee: Yantel Corporation, Shenzhen (CN)

( * ) Notice: Subject to any disclaimer, the term of this patent is extended or adjusted under 35 U.S.C. 154(b) by 16 days.

This patent is subject to a terminal disclaimer.

(21) Appl. No.: 12/429,373

(22) Filed: Apr. 24, 2009

(65) Prior Publication Data

US 2009/0231067 A1    Sep. 17, 2009

Related U.S. Application Data

(63) Continuation-in-part of application No. 12/106,408, filed on Apr. 21, 2008, now Pat. No. 7,528,677, which is a continuation-in-part of application No. 10/597,985, filed as application No. PCT/CN2005/000586 on Apr. 28, 2005, now Pat. No. 7,362,196.

(30) Foreign Application Priority Data

May 18, 2004 (CN) .......................... 2004 1 0027307
Dec. 7, 2008 (CN) .......................... 2008 1 0190568

(51) Int. Cl.
*H01P 1/22* (2006.01)
(52) U.S. Cl. .................................... 333/81 R; 333/81 A
(58) Field of Classification Search ................ 333/81 R, 333/81 A; 338/216
See application file for complete search history.

(56) References Cited

U.S. PATENT DOCUMENTS

| | | | | |
|---|---|---|---|---|
| 5,332,981 A | * | 7/1994 | Mazzochette et al. | 333/81 R |
| 6,472,949 B1 | * | 10/2002 | Yamazaki et al. | 333/81 R |
| 7,528,677 B2 | * | 5/2009 | Yan et al. | 333/81 R |

* cited by examiner

*Primary Examiner* — Stephen Jones
(74) *Attorney, Agent, or Firm* — Matthias Scholl P.C.; Matthias Scholl

(57) ABSTRACT

A temperature compensation attenuator formed from a base, a serial film thermistor having two ends, a parallel film resistor, an input terminal, and an output terminal. The serial film thermistor and the parallel film resistor are disposed on the base, the input terminal and the output terminal are connected to the two ends of the serial film thermistor. The temperature compensation attenuator features a small size, good RF performance and simple production, and solves the problem of easy detachment of discrete components from the attenuator.

7 Claims, 3 Drawing Sheets

TEMPERATURE COMPENSATION ATTENUATOR

CROSS REFERENCE TO RELATED APPLICATIONS

This application is a continuation in part of U.S. Ser. No 12/106,408 filed on Apr. 21, 2008, now pending, which is a continuation in part of U.S. Ser. No. 10/597,985 filed on Aug. 18, 2006, now U.S. Pat. No. 7,362,196, granted Apr. 22, 2008, which is a National Stage Application of International Patent Application No. PCT/CN2005/000586, which is based on Chinese Patent Application No. 200410027307.7, filed May 18, 2004. This application further claims priority pursuant to 35 U.S.C. §119 and the Paris Convention Treaty to Chinese Patent Application No. 200810190568.9 filed Dec. 7, 2008. The contents of all of these specifications are incorporated herein by reference.

BACKGROUND OF THE INVENTION

1. Field of the Invention

The invention relates to temperature compensation attenuators for compensating temperature characteristics of high frequency or microwave devices and systems used in electronics and communication. The attenuators can be applied in various circuits and systems utilizing high frequency waves or microwaves, and more particularly, are suitable for use in mobile communication systems, satellite communication systems, satellite navigational systems, and radar systems which require strict temperature characteristics.

2. Description of the Related Art

Temperature compensation attenuators are widely used in RF circuits. To obtain temperature compensation attenuators with good RF performance, discrete components used in the temperature compensation attenuators should be as small as possible. This causes inconvenience and difficulties during production. Moreover, high operating temperature often results in detachment of small discrete components, which negatively affects reliability of the attenuators. In addition, due to the fact that a film thermistor (NTC) with a high temperature coefficient and low resistance covers a large area on the base (substrate), it is often desirable to reduce the number of devices used in an attenuator. This would result in a temperature compensation attenuator with a wide temperature variation range. Increasing the number of film resistors will greatly increase production difficulty. Moreover, a thermistor connected in parallel with a general resistor features a smaller temperature variation range compared to a single thermistor structure having the same size and amount of material.

BRIEF DESCRIPTION OF THE INVENTION

In view of the above-described problem, it is one objective of the invention to provide a temperature compensation attenuator that features a small size, good RF performance and simple production, and solves the problem of detachment of discrete components.

To achieve the above objectives, in accordance with one embodiment of the invention, provided is a temperature compensation attenuator comprising a base, a serial film thermistor having two ends, a parallel film resistor, an input terminal, and an output terminal, wherein the serial film thermistor and the parallel film resistor are disposed on the base, the input terminal and the output terminal are connected to the two ends of the serial film thermistor, and the parallel film resistor does not comprise a thermistor.

In another class of this embodiment, the film thermistor has a negative temperature coefficient or positive temperature coefficient.

In another class of this embodiment, the attenuator being a π-type attenuator, a T-type attenuator, or a bridge-type attenuator.

In another class of this embodiment, the serial film thermistor is a thick film resistor.

In another class of this embodiment, the parallel film resistor 2 is a thick film resistor.

In another embodiment of the invention described herein, provided is a temperature compensation attenuator comprising a base, a serial film thermistor having two ends, a parallel film resistor, an input terminal, and an output terminal, wherein the serial film thermistor and the parallel film resistor are disposed on the base, the input terminal and the output terminal are connected to the two ends of the serial film thermistor, the parallel film resistor does not comprise a thermistor, and the serial film thermistor and the parallel film resistor are integrally printed on the base, followed by high temperature firing.

In another class of this embodiment, the film thermistor has a negative temperature coefficient or a positive temperature coefficient.

In another class of this embodiment, the attenuator being a π-type attenuator, a T-type attenuator, a bridge-type attenuator or a combination of thereof.

In another class of this embodiment, the serial film thermistor is a thick film thermistor.

In another class of this embodiment, the parallel film resistor is a thick film resistor.

In another class of this embodiment, the base is a ceramic base; and a temperature of integrally firing the serial film thermistor and the parallel film resistor on the base is between 700° C. and 900° C.

In a further embodiment of the invention described herein, provided is a temperature compensation attenuator comprising a ceramic base, a serial film thermistor having two ends, a first film, an input terminal, an output terminal, and a second film, wherein the serial film thermistor and the first film are disposed on the base, the input terminal and the output terminal are connected to the two ends of the serial film thermistor, at least a part of a surface of the serial film thermistor is contacted with the second film, and the serial film thermistor, the first film and the second film are integrally printed on the base, followed by high temperature firing In another class of this embodiment, the thermistor has a negative temperature coefficient or positive temperature coefficient.

In another class of this embodiment, the attenuator being a π-type attenuator, a T-type attenuator, or a bridge-type attenuator or a combination thereof.

In another class of this embodiment, the serial film thermistor is a thick film thermistor. In another class of this embodiment, the first film is a parallel film resistor or a parallel film thermistor.

In another class of this embodiment, the second film is a film resistor or a film conductor.

In another class of this embodiment, the firing temperature of the serial film thermistor, the first film, and the second film is between 700° C. and 900° C.

By utilizing the serial film thermistor of the invention, a wideband temperature compensation attenuator with a distributed parameter circuit structure is constructed wherein the amount of attenuation varies with temperature. By connecting the temperature compensation attenuator of the invention to a high frequency or microwave active circuit, it can compensate for the variance of the gain of the high frequency or microwave active device or the drift of the frequency characteristic of the active device resulting from temperature variance. Even under large environmental temperature variance, the attenuator of the invention can still ensure the stability of the gain of the high frequency or microwave active device and compensate for the drift of the frequency characteristic of the active device.

Advantages of the invention include the following:
1) small attenuator size, good RF performance, and high rated power;
2) simple production and high reliability;
3) solving the problem of easy detachment of discrete components from the attenuator.

BRIEF DESCRIPTION OF THE DRAWINGS

The invention is described herein below with reference to accompanying drawings, in which.

DETAILED DESCRIPTION OF THE INVENTION

Figure 1:
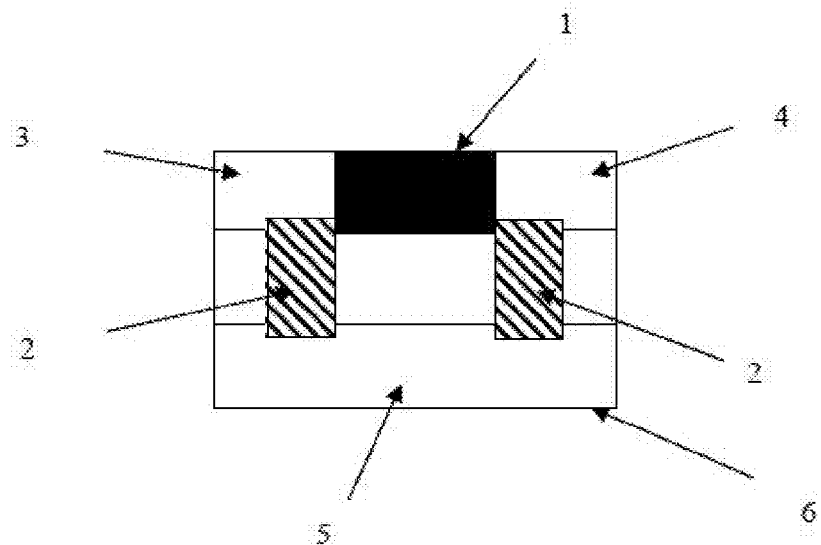
FIG. 1 is a schematic drawing of a temperature compensation attenuator according to the first embodiment of the invention.

With reference to FIG. 1, the temperature compensation attenuator according the first embodiment of the invention comprises a serial film thermistor 1 and a parallel film resistor 2, an input terminal 3, an output terminal 4, ground 5 and a base 6. The serial film thermistor 1 has a negative temperature coefficient or a positive temperature coefficient. The input terminal 3 and the output terminal 4 are connected to both ends of the serial film thermistor 1. The parallel film resistor 2 does not comprise a thermistor, i.e., its resistance does not vary substantially (it is nearly constant) over a temperature range, in which the attenuator is designed to operate.

The serial film thermistor 1 is a thick film resistor. The parallel film resistor 2 is a thick film resistor.

The parallel film resistor 2 is a general-type film resistor, the resistance value of which is nearly constant with temperature. One end (side) of the parallel film resistor 2 is connected to a ground terminal 5 and the other end (side) is connected to the input-output terminal. The serial film thermistor 1, the parallel film resistor 2, the input terminal 3, the output terminal 4, and the ground terminal 5 form a π-type attenuator on the surface of the base 6.

A resistor connected in series to the input and output terminals is termed a serial resistor, and a resistor of which one end is connected to the ground terminal is termed a parallel resistor. Attenuators according to the invention are classified as π-type attenuators, T-type attenuators, bridge-type attenuators, or a combination thereof.

When temperature increases, the resistance value of the film thermistor having a negative temperature coefficient (NTC) decreases; thus the attenuation of the π-type attenuator decreases to realize stable compensation. Similarly, when temperature decreases, the resistance value of the film thermistor increases; thus the attenuation of the π-type attenuator increases to realize stable compensation.

If a thermistor having a positive temperature coefficient is selected as the parallel film resistor 2 and a thermistor having a negative temperature coefficient is selected as the serial film thermistor 1, temperature compensation of the attenuator is achieved more advantageously. However, using two thermistors in the attenuator design would cause higher costs with respect to design and manufacture. To solve this problem, advantage is taken of the fact that the serial resistor largely determines the attenuation, and the influence of the parallel resistor on attenuation is negligible. Particularly, since heat is generated during laser trimming, it is often very difficult to adjust the resistance value of a film thermistor via laser. Moreover, a lead-free resistive paste is currently available, but PTC paste can be hardly lead-free; therefore, it is favorable to use a lead-free resistive paste as the parallel film resistor 2, which reduces the lead content and allows the temperature compensation attenuator to meet the lead-free standard easily.

In this embodiment, the base 6 can also be a ceramic base. Three electrodes comprising the input terminal 3, the output terminal 4, and the ground terminal 5 are fired on the base 6. The serial film thermistor 1 and the parallel film resistor 2 are integrally printed on the base 6, followed by high temperature firing. The firing temperature is between 700° C. and 900° C.

The temperature compensation attenuator in this embodiment features a very small size (for example 2.0×1.2×0.53 mm), good temperature and RF performance and a large rated power, and it is suitable for mass production.

Due to the fact that a thermistor (NTC) with a high temperature coefficient and low resistance covers a large area on the base (substrate), it is often desirable to reduce the number of devices used in an attenuator. This would result in a temperature compensation attenuator with a wide temperature variation range. Increasing the number of film resistors will greatly increase production difficulty. Moreover, a thermistor connected in parallel with a general resistor features a smaller temperature variation range compared to a single thermistor structure having the same size and amount of material.

The serial film thermistor 1 can be a thick film thermistor and the parallel film resistor 2 can be a thick film resistor. When fired under a high temperature between 700° C. and 900° C., the serial film thermistor 1 can only be a thick film thermistor and the parallel film resistor 2 can only be a thick film resistor.

Figure 2:
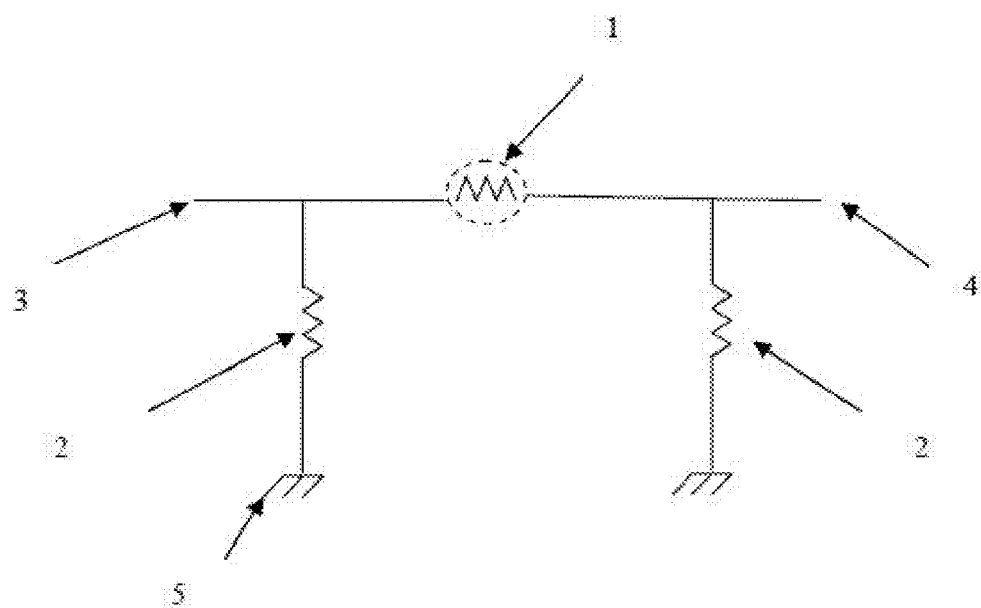
FIG. 2 is an equivalent circuit diagram of the temperature compensation attenuator illustrated in FIG. 1.

With reference to FIG. 2, the π-type attenuator comprises the serial film thermistor 1 and a pair of parallel film resistors 2.

Figure 3:
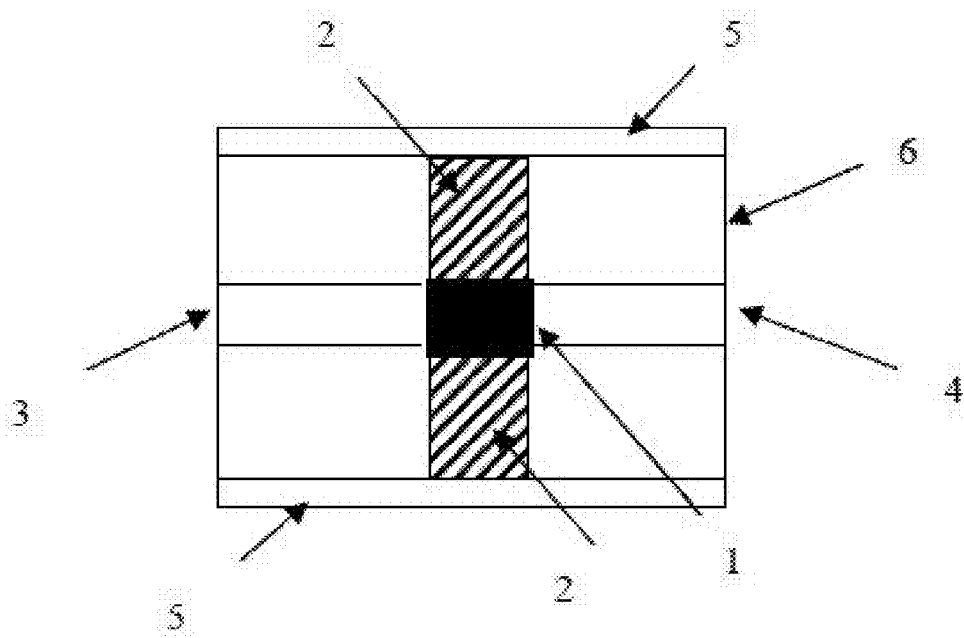
FIG. 3 is a schematic drawing of a temperature compensation attenuator according to the second embodiment of the invention.

With reference to FIG. 3, a temperature compensation attenuator of a second embodiment of the invention is a combination of a π-type attenuator and a T-type attenuator, and comprises a serial film thermistor 1 and a parallel film resistor 2.

Figure 4:
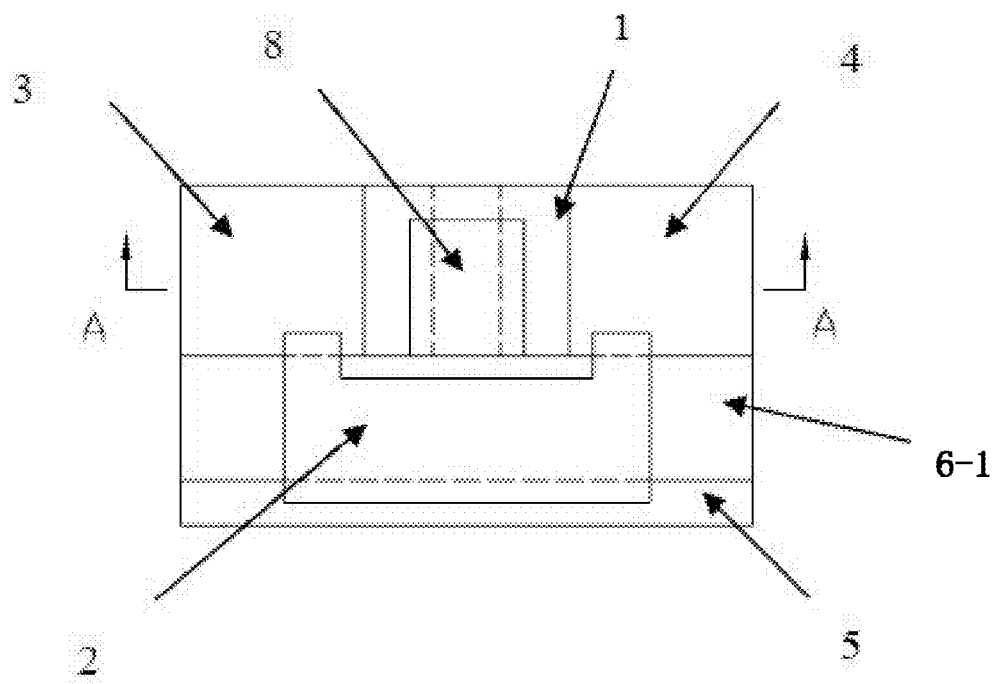
FIG. 4 is a schematic drawing of a temperature compensation attenuator according to the third embodiment of the invention.

With reference to FIG. 4, a temperature compensation attenuator of a third embodiment of the invention comprises a ceramic base 61, a serial film thermistor 1, a first film 2, an input terminal 3, an output terminal 4, a second film 8, and a ground 5. The serial film thermistor 1 and the first film 2 are disposed on the base 6-1. The input terminal 3 and the output terminal 4 are connected to both ends of the serial film thermistor 1.

The attenuator is a π-type attenuator, a T-type attenuator, a bridge-type attenuator, or a combination thereof. The serial film thermistor 1 has a negative temperature coefficient or a positive temperature coefficient, and is a thick film thermistor. In this embodiment, the serial film thermistor 1 is a rectangular thick film thermistor. In other embodiments, the serial film thermistor 1 can be polygonal, arc-shaped, and so on.

In this embodiment, the first film 2 is a parallel film resistor or a parallel film thermistor having a temperature coefficient opposite to that of the serial film thermistor 1.

The second film 8 can be a thick film resistor, or a conductive film. In this embodiment, the second film 8 is a rectangular thick film resistor having a low resistance value. In other embodiments, the second film 8 can be polygonal, arc-shaped, and so on.

The firing temperature for the serial film thermistor 1, the first film 2, and the second film 8 is between 700° C. and 900° C.

Figure 5:
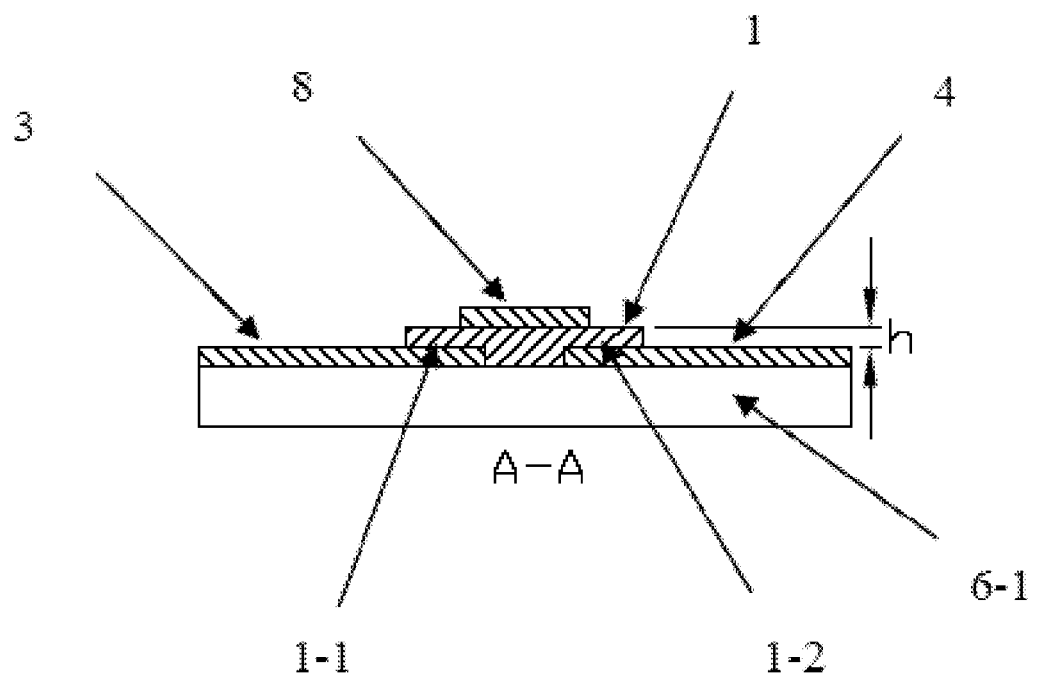
FIG. 5 is a cross-sectional view taken along the line A-A in FIG. 4.

With reference to FIG. 5, both ends 1-1 and 1-2 of the serial film thermistor 1 are connected to the input terminal 3 and the output terminal 4, respectively. At least a part of or all the surface of the serial film thermistor 1 are contacted with the bottom of the second film 8. The thickness of the serial film thermistor 1 is h.

The second film 8 can be a thick film resistor with a low resistance value, which is easy for production and features a mature technology.

For the serial film thermistor 1 having a negative temperature coefficient, the temperature coefficient is largely affected by the thickness thereof, and it is a difficult problem for a resistor with a low square resistance (resistance per square unit) and a high temperature coefficient. To obtain a low square resistance value and a high temperature coefficient for a fixed-size resistor, the space between the input terminal 3 and the output terminal 4 is required to be very narrow. A space of 0.1 mm can hardly be realized using thick film technology, and it is quite easy to implement a thickness of a film thermistor or a resistor of several μm.

As shown in FIG. 5, the desired equivalent resistance between input terminal 3 and the output terminal 4 can be realized by the serial film thermistor 1 having a negative temperature coefficient and an optimal thickness h, along with the second film 8 with different resistance values, and thus solve the difficult problem of implementing a thermistor having a negative temperature coefficient with a low square resistance and a high temperature coefficient in a small-sized temperature compensation attenuator.

The serial film thermistor 1, the first film 2 and the second film 8 are integrally fired under high temperature to form a chip, and a rated power, reliability and RF performance of the temperature compensation attenuator is improved.

Moreover, under the same size of the serial film thermistor, the same square resistance, the same temperature coefficient and the same size of the second film 8, by choosing the second film 8 with different resistance values, it is possible to change the equivalent resistance and the temperature coefficient between the input terminal 3 and the output terminal 4. For instance, for a given size and temperature coefficient, the equivalent resistance between the input terminal 3 and the output terminal 4 is only up to 70 Ohm without the second film 8, which makes it difficult to implement a temperature compensation attenuator with small size attenuation. If a second film 8 having resistance of only 7 Ohm is used, the equivalent resistance can be up to 6 Ohm. The second film 8 is connected between the input terminal 3 and the output terminal 4 of the temperature compensation attenuator via a top portion (with the thickness of h) of the serial film thermistor 1. The temperature coefficient of the equivalent resistor is mainly determined by the temperature coefficient of the serial film thermistor 1.

At least a part of the surface of the second film 8 is contacted with the input terminal 3 or the output terminal 4. This structure is capable of implementing a resistor there between that features a low equivalent resistance value and a high temperature coefficient. In other embodiments, the second film 8 is also contacted with the input terminal 3 and the output terminal 4, so as to significantly decrease the temperature coefficient of the equivalent resistor.

This invention is not to be limited to the specific embodiments disclosed herein and modifications for various applications and other embodiments are intended to be included within the scope of the appended claims. While this invention has been described in connection with particular examples thereof, the true scope of the invention should not be so limited since other modifications will become apparent to the skilled practitioner upon a study of the drawings, specification, and following claims.

What is claimed is:

1. A temperature compensation attenuator comprising
a base (6);
a serial film thermistor (1) having two ends;
a parallel film resistor (2);
an input terminal (3); and
an output terminal (4);
wherein
said serial film thermistor (1) and said parallel film resistor (2) are disposed on said base (6);
said input terminal (3) and said output terminal (4) are connected to the two ends of said serial film thermistor (1);
said parallel film resistor (2) is directly contacted to said serial film thermistor (1); and
said parallel film resistor (2) does not comprise a thermistor.

2. The attenuator of claim 1, said attenuator being a π-type attenuator, a T-type attenuator, or a bridge-type attenuator.

3. The attenuator of claim 1, wherein said serial film thermistor (1) is a thick film thermistor, said parallel film resistor (2) is a thick film resistor.

4. The attenuator of claim 1, wherein said film thermistor (1) has a negative temperature coefficient or a positive temperature coefficient.

5. The attenuator of claim 4, wherein said parallel film resistor (2) comprises a first parallel film resistor and a second parallel film resistor.

6. A temperature compensation attenuator consisting of
a base (6);
a serial film thermistor (1) having two ends;
a parallel film resistor (2);
an input terminal (3); and
an output terminal (4);
wherein
said serial film thermistor (1) and said parallel film resistor (2) are disposed on said base (6);
said input terminal (3) and said output terminal (4) are connected to the two ends of said serial film thermistor (1);
said parallel film resistor (2) is directly contacted to said serial film thermistor (1); and
said parallel film resistor (2) does not comprise a thermistor.

7. A temperature compensation attenuator consisting essentially of
a base (6);

a serial film thermistor (1) having two ends;

a parallel film resistor (2);

an input terminal (3); and an output terminal (4);

wherein said serial film thermistor (1) and said parallel film resistor (2) are disposed on said base (6);

said input terminal (3) and said output terminal (4) are connected to the two ends of said serial film thermistor (1);

said parallel film resistor (2) is directly contacted to said serial film thermistor (1); and said parallel film resistor (2) does not comprise a thermistor.

* * * * *